United States Patent
Zang et al.

(10) Patent No.: US 9,129,986 B2
(45) Date of Patent: Sep. 8, 2015

(54) SPACER CHAMFERING FOR A REPLACEMENT METAL GATE DEVICE

(71) Applicant: GLOBALFOUNDRIES Inc., Grand Cayman (KY)

(72) Inventors: Hui Zang, Albany, NY (US); Hyun-Jin Cho, Palo Alto, CA (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/929,923

(22) Filed: Jun. 28, 2013

(65) Prior Publication Data

US 2015/0001627 A1    Jan. 1, 2015

(51) Int. Cl.
*H01L 29/66* (2006.01)
*H01L 29/78* (2006.01)

(52) U.S. Cl.
CPC ...... *H01L 29/66545* (2013.01); *H01L 29/6653* (2013.01); *H01L 29/66795* (2013.01); *H01L 29/785* (2013.01)

(58) Field of Classification Search
CPC ............ H01L 29/66795; H01L 29/785; H01L 29/66545; H01L 29/7848; H01L 21/823814; H01L 29/66636; H01L 29/66628; H01L 29/7834; H01L 21/823821; H01L 21/845; H01L 27/1211; H01L 21/823431; H01L 29/6653; H01L 27/0886; H01L 21/8238
USPC .................................................. 257/360–370
See application file for complete search history.

(56) References Cited

U.S. PATENT DOCUMENTS

| | | | |
|---|---|---|---|
| 8,536,040 B1 | 9/2013 | Park | |
| 8,664,103 B2 | 3/2014 | Hempel et al. | |
| 2012/0315749 A1 | 12/2012 | Hempel et al. | |
| 2013/0075821 A1* | 3/2013 | Baars et al. | 257/368 |
| 2013/0200468 A1* | 8/2013 | Cai et al. | 257/401 |
| 2013/0260548 A1 | 10/2013 | Park | |
| 2013/0277686 A1* | 10/2013 | Liu et al. | 257/77 |
| 2013/0295738 A1* | 11/2013 | Kuo et al. | 438/283 |
| 2013/0302974 A1 | 11/2013 | Hahn et al. | |
| 2013/0302976 A1* | 11/2013 | Tsai et al. | 438/589 |
| 2014/0015055 A1* | 1/2014 | Flachowsky et al. | 257/368 |
| 2014/0027816 A1* | 1/2014 | Cea et al. | 257/192 |
| 2014/0045315 A1 | 2/2014 | Witters | |
| 2014/0264596 A1* | 9/2014 | He et al. | 257/347 |

* cited by examiner

*Primary Examiner* — Wael Fahmy
*Assistant Examiner* — Nelson Garces
(74) *Attorney, Agent, or Firm* — Williams Morgan, P.C.

(57) ABSTRACT

Approaches for spacer chamfering in a replacement metal gate (RMG) device are provided. Specifically, a semiconductor device is provided with a set of fins formed from a substrate; a silicon-based layer conformally deposited over the set of fins; an etch-stop layer (e.g., titanium nitride (TiN)) formed over the silicon-based layer, the etch-stop layer being selective to at least one of: silicon, oxide, and nitride; a set of RMG structures formed over the substrate; a set of spacers formed along each of the set of RMG structures, wherein a vertical layer of material from each of the set of spacers is removed selective to the etch-stop layer. By chamfering each sidewall spacer, a wider area for subsequent work-function (WF) metal deposition is provided. Meanwhile, each transistor channel region is covered by the etch-stop layer (e.g., TiN), which maintains the original gate critical dimension during reactive ion etching.

14 Claims, 6 Drawing Sheets

SPACER CHAMFERING FOR A REPLACEMENT METAL GATE DEVICE

BACKGROUND

1. Technical Field

This invention relates generally to the field of semiconductors, and more particularly, to approaches for spacer chamfering for a replacement metal gate (RMG) device.

2. Related Art

A typical integrated circuit (IC) chip includes a stack of several levels or sequentially formed layers of shapes. Each layer is stacked or overlaid on a prior layer and patterned to form the shapes that define devices (e.g., fin field effect transistors (FinFETs)) and connect the devices into circuits. In a typical state of the art complementary insulated gate FinFET process, such as what is normally referred to as CMOS, layers are formed on a wafer to form the devices on a surface of the wafer. Further, the surface may be the surface of a silicon layer on a silicon on insulator (SOI) wafer. A simple FinFET includes a gate layer rectangle on a silicon island formed from the silicon surface layer. Each of these layers of shapes, also known as mask levels or layers, may be created or printed optically through well known photolithographic masking, developing and level definition, e.g., etching, implanting, deposition, etc.

Silicon based FinFETs have been successfully fabricated using conventional MOSFET technology. A typical FinFET is fabricated on a substrate with an overlying insulating layer with a thin 'fin' extending from the substrate, for example, etched into a silicon layer of the substrate. The channel of the FET is formed in this vertical fin. A single or double gate is provided over the fin(s). A double gate is beneficial in that there is a gate on both sides of the channel allowing gate control of the channel from both sides. Further advantages of FinFETs include reducing the short channel effect and higher current flow. Other FinFET architectures may include three or more effective gates.

As FinFETs continue to shrink in size (e.g., 10 nm and beyond), a work-function metal chamfering process is necessary to achieve a desired threshold voltage (Vth). However, the nominal gate conductor (PC) critical dimension (CD) is challenging for the chamfering process and subsequent metal fill process at this device size. Prior art approaches have attempted to widen the spacer using a spacer inner etch (i.e., a poly pull back) for a portion of the spacer.

This is shown in FIG. 1 in which prior art device 10 comprises a set of finFETs 12 formed over a substrate 14 and a source trench isolation (STI) material 16. Spacers 18 are formed along each FinFET 12. As demonstrated in prior art device 10 of FIG. 2, a half poly pull back is performed to remove polysilicon 20 and a portion of spacers 18. However, this approach suffers from a number of drawbacks. First, this process is difficult to control because the polysilicon reactive ion etch (RIE) must be controlled by time, which produces poor uniformity within the wafer and negatively influences yield. Second, a poly overetch may lead to fin damage, which degrades overall device performance. Third, this approach only widens the spacer above each finFET 12, but does not widen the region below the fin to maintain the gate CD, which is critical for work-function metal deposition.

SUMMARY

In general, embodiments herein provide approaches for spacer chamfering in a RMG device. Specifically, a semiconductor device is provided with a set of fins formed from a substrate; a silicon-based layer conformally deposited over the set of fins; an etch-stop layer (e.g., titanium nitride (TiN)) formed over the silicon-based layer, the etch-stop layer being selective to at least one of: silicon, oxide, and nitride; a set of RMG structures formed over the substrate; a set of spacers formed along each of the set of RMG structures, wherein a vertical layer of material from each of the set of spacers is removed selective to the etch-stop layer. By chamfering each sidewall spacer, a wider area for subsequent work-function (WF) metal deposition is provided. Meanwhile, each transistor channel region is covered by the etch-stop layer, which maintains the original gate critical dimension during reactive ion etching.

One aspect of the present invention includes a method for forming a semiconductor device, the method comprising: forming a set of fins from a substrate; conformally depositing a silicon-based layer over the set of fins; forming an etch-stop layer over the silicon-based layer, the etch-stop layer having a selectivity to at least one of: silicon, oxide, and nitride; forming a set of replacement metal gate (RMG) structures over the substrate; forming a set of spacers along each of the set of RMG structures; forming a plurality of epitaxial (epi) junction areas along the set of fins between each of the set of RMG structures; depositing an oxide over the set of fins; removing a gate electrode from each of the set of RMG structures; and removing a portion of each of the set of spacers to a top surface of the etch-stop layer.

Another aspect of the present invention includes a method of chamfering a spacer for a replacement metal gate (RMG) structure, the method comprising: forming a set of fins from a substrate; conformally depositing a silicon-based layer over the set of fins; forming an etch-stop layer over the silicon-based layer, the etch-stop layer having a selectivity to at least one of: silicon, oxide, and nitride; forming a set of replacement metal gate (RMG) structures over the substrate; forming a set of spacers along each of the set of RMG structures; forming a plurality of epitaxial (epi) junction areas along the set of fins between each of the set of RMG structures; depositing an oxide over the set of fins; removing a gate electrode from each of the set of RMG structures; and removing a portion of each of the set of spacers to a top surface of the etch-stop layer.

Another aspect of the present invention includes a semiconductor device, comprising: a set of fins formed from a substrate; a silicon-based layer conformally deposited over the set of fins; an etch-stop layer formed over the silicon-based layer, the etch-stop layer having a selectivity to at least one of: silicon, oxide, and nitride; a set of replacement metal gate (RMG) structures formed over the substrate; and a set of spacers formed along each of the set of RMG structures, wherein a portion of material from each of the set of spacers is removed selective to the etch-stop layer.

BRIEF DESCRIPTION OF THE DRAWINGS

These and other features of this invention will be more readily understood from the following detailed description of the various aspects of the invention taken in conjunction with the accompanying drawings in which.

Figure 1:
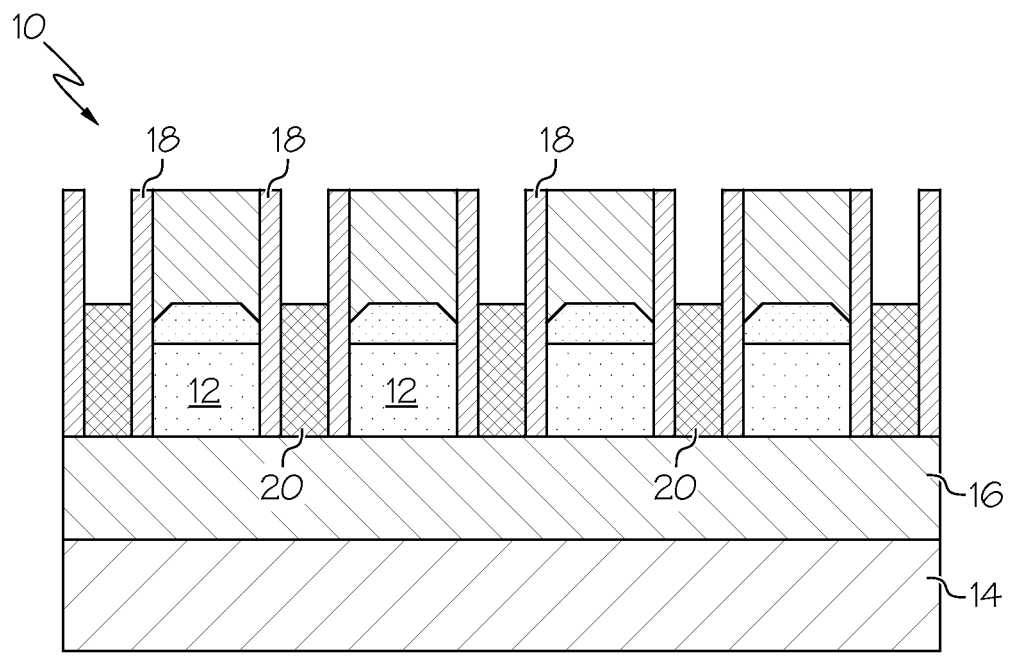
FIG. 1 shows a cross-sectional view of a prior art semiconductor device.
Figure 2:
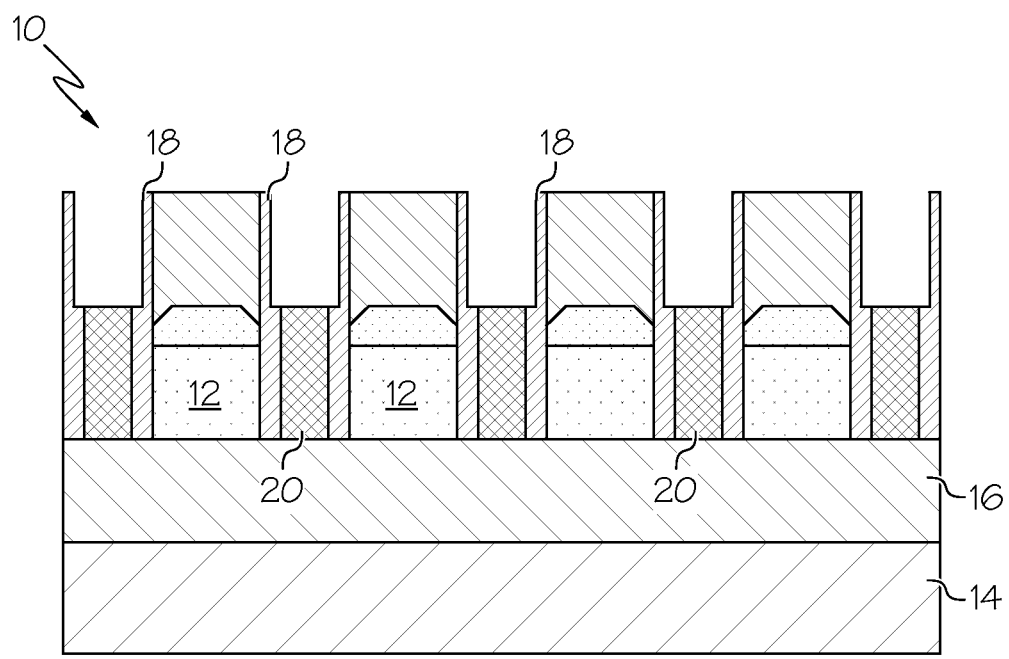
FIG. 2 shows a cross-sectional view of a prior art semiconductor device.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are approaches for spacer chamfering in a RMG device. Specifically, a semiconductor device is provided with a set of fins formed from a substrate; a silicon-based layer conformally deposited over the set of fins; an etch-stop layer (e.g., titanium nitride (TiN)) formed over the silicon-based layer, the etch-stop layer being selective to at least one of: silicon, oxide, and nitride; a set of RMG structures formed over the substrate; a set of spacers formed along each of the set of RMG structures, wherein a vertical layer of material from each of the set of spacers is removed selective to the etch-stop layer. By chamfering each sidewall spacer, a wider area for subsequent workfunction (WF) metal deposition is provided. Meanwhile, each transistor channel region is covered by the etch-stop layer (e.g., TiN), which maintains the original gate critical dimension during reactive ion etching.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 3:
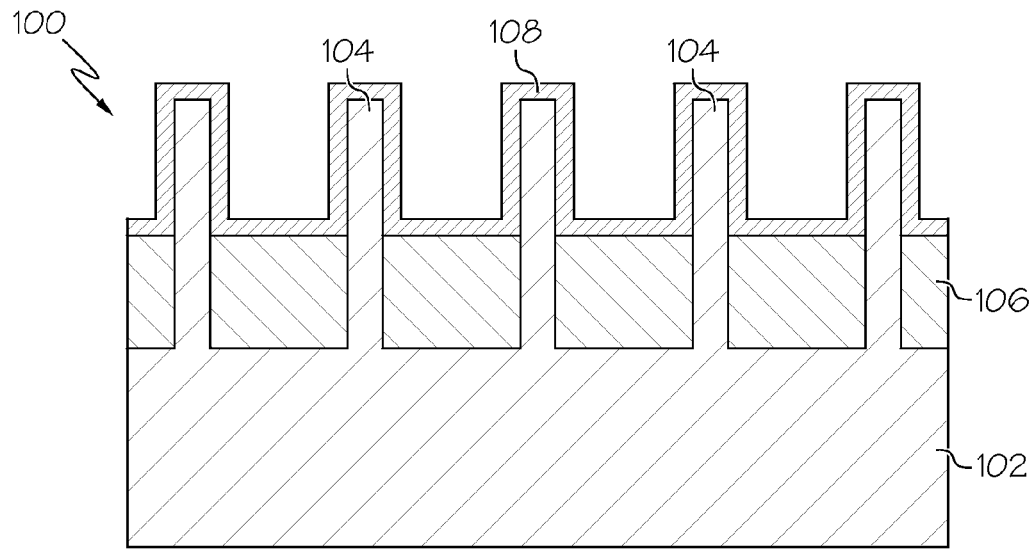
FIG. 3 shows a cross-sectional view of the formation of an etch-stop layer and a SiO2 layer over a set of fins according to illustrative embodiments.

With reference again to the figures, FIG. 3 shows a cross sectional view of a device 100 according to an embodiment of the invention. Device 100 comprises a substrate 102 (e.g., silicon) and a plurality of fins 104 formed thereon. Device 100 further comprises a source trench isolation (STI) oxide 106 disposed between each of fins 104. STI oxide 106 may include any suitable insulating material.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

Fins 104 may be fabricated using any suitable process including one or more photolithography and etch processes. The photolithography process may include forming a photoresist layer (not shown) overlying STI oxide 106 (e.g., on a silicon layer), exposing the resist to a pattern, performing post-exposure bake processes, and developing the resist to form a masking element including the resist. The masking element may then be used to etch fins 104 into the silicon layer, e.g., using reactive ion etch (RIE) and/or other suitable processes.

In one embodiment, fins 104 are formed by a double-patterning lithography (DPL) process. DPL is a method of constructing a pattern on a substrate by dividing the pattern into two interleaved patterns. DPL allows enhanced feature (e.g., fin) density. Various DPL methodologies may used including, double exposure (e.g., using two mask sets), forming spacers adjacent features and removing the features to provide a pattern of spacers, resist freezing, and/or other suitable processes.

Device 100 further comprises a silicon-based (e.g., SiO2) layer and etch-stop layer (e.g., TiN) (shown together as etch-stop layer 108) formed over fins 104. In one embodiment, a conformal layer of SiO2 (e.g., 2-3 nm) is formed over fins 104, followed by TiN (e.g., 8-10 nm) to form layer etch-stop layer 108. It will be appreciated that etch-stop layer 108 may can be any number of different materials having a selectivity to Si oxide, and/or nitride.

Figure 4:
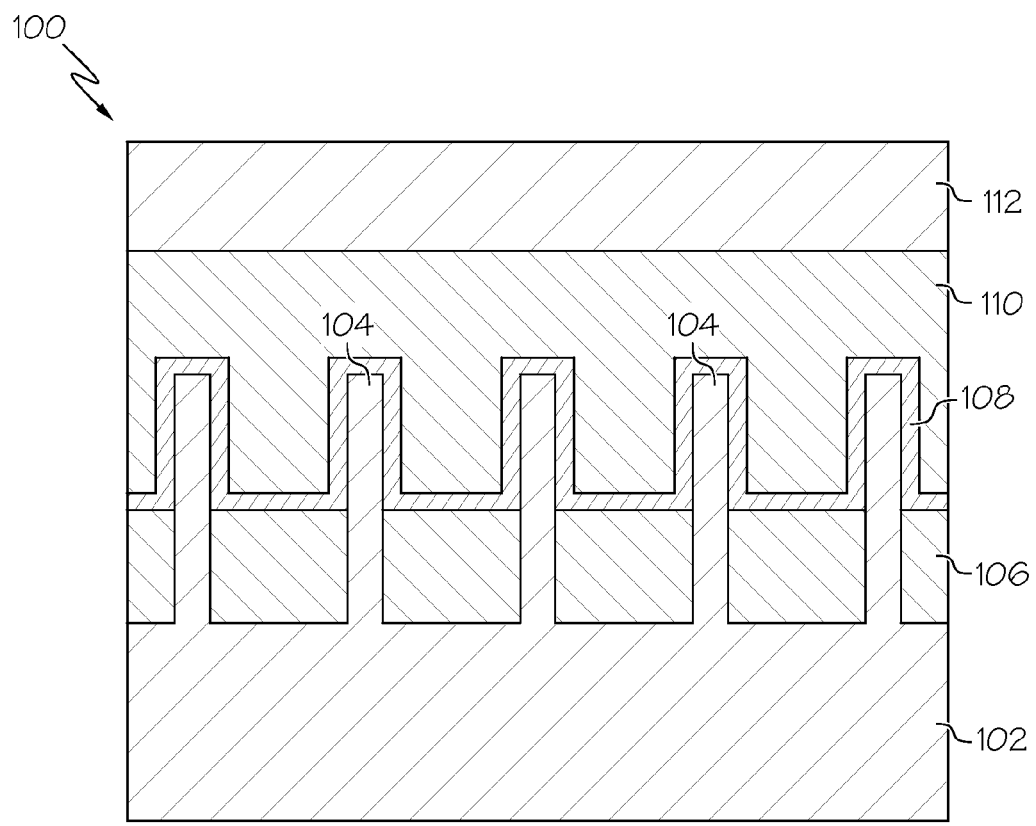
FIG. 4 shows a cross-sectional view of the formation of a gate electrode layer according to illustrative embodiments.

Next, as shown in FIG. 4, a gate electrode layer 110 is deposited over device 100, followed by a SiN cap 112. Gate electrode layer 110 may include polysilicon, silicon-germanium, a metal including metal compounds such as, Mo, Cu, W, Ti, Ta, TiN, TaN, NiSi, CoSi, and/or other suitable conductive materials known in the art. Gate electrode 110 may be formed using processes such as, physical vapor deposition (PVD), CVD, plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/ or other suitable processes which may be followed, for example, by photolithography and/or etching processes.

Figure 5:
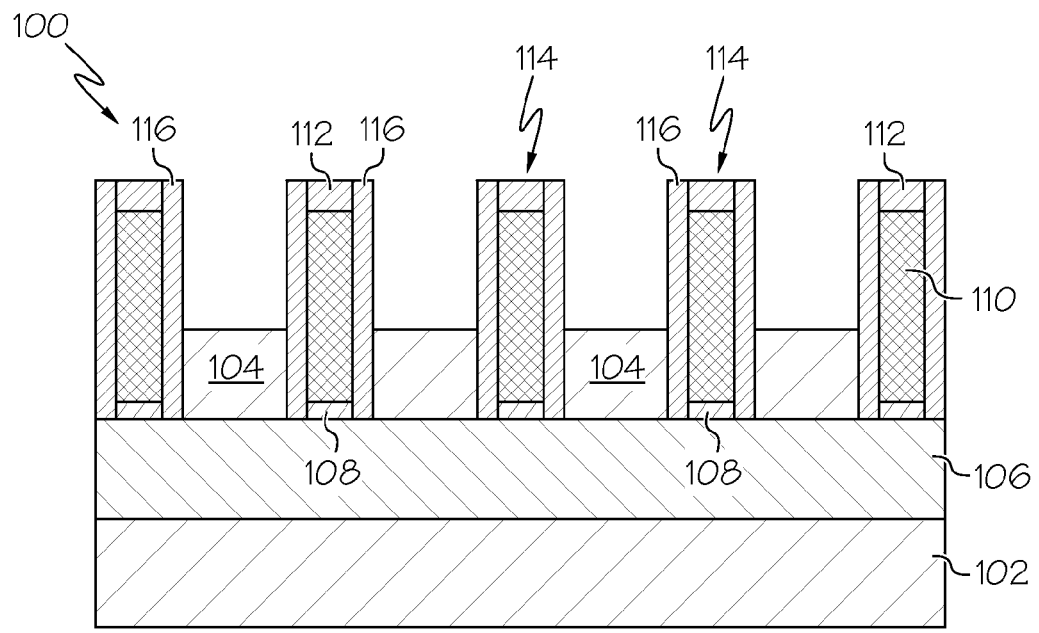
FIG. 5 shows a cross-sectional view of the formation of a set of spacers according to illustrative embodiments.
Figure 6:
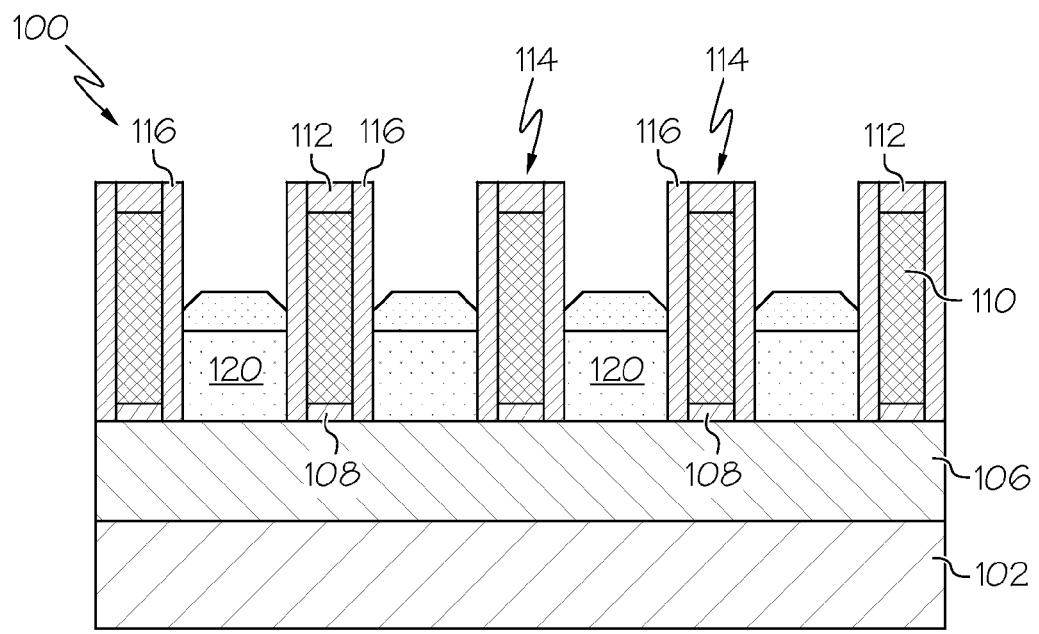
FIG. 6 shows a cross-sectional view of the formation of a plurality of epitaxial junction areas over the set of fins according to illustrative embodiments.

As a result of a polysilicon stack etch ("PC etch"), a set of RMG structures 114 are then formed over STI oxide 106, as shown in FIG. 5. In this embodiment, to form RMG structures 114, etch-stop layer 108 is etched using a reactive ion etch (RIE) process, SiO2 layer is removed, and a set of spacers 116 are formed along the sidewalls of each RMG structure 114. This is followed by the formation of a set of epitaxial (epi) junction areas 120 along fins 104 and between each RMG structure 114. In this embodiment, epi junction areas 120 are grown for n/p FETs, with or without an optional second spacer (not shown).

Figure 7:
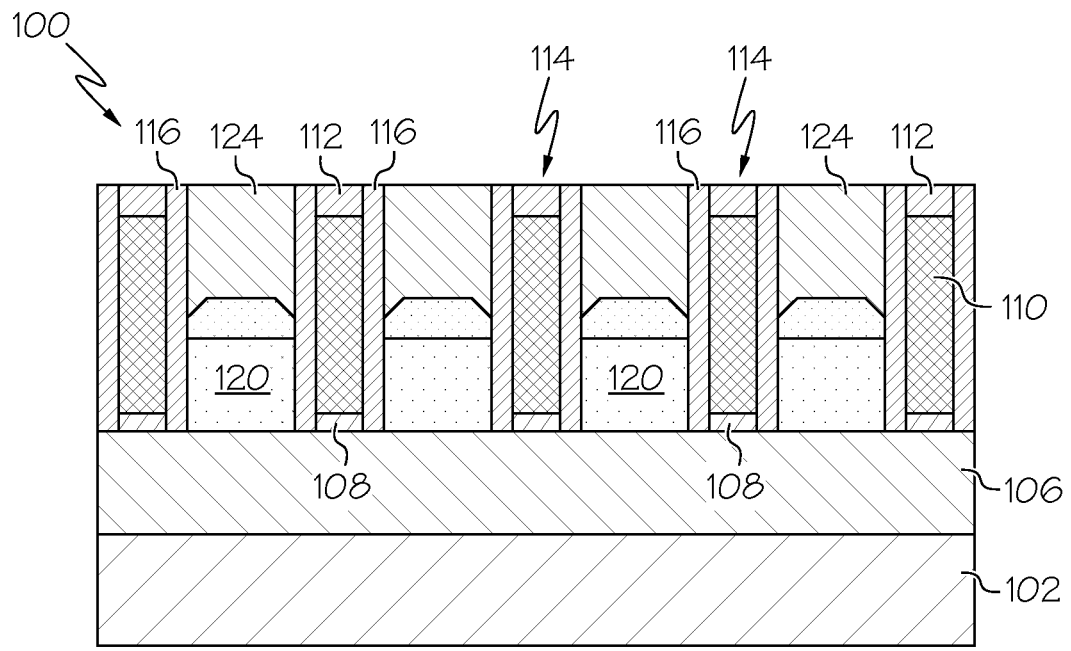
FIG. 7 shows a cross-sectional view of the formation of an oxide material over the fins according to illustrative embodiments.
Figure 8:
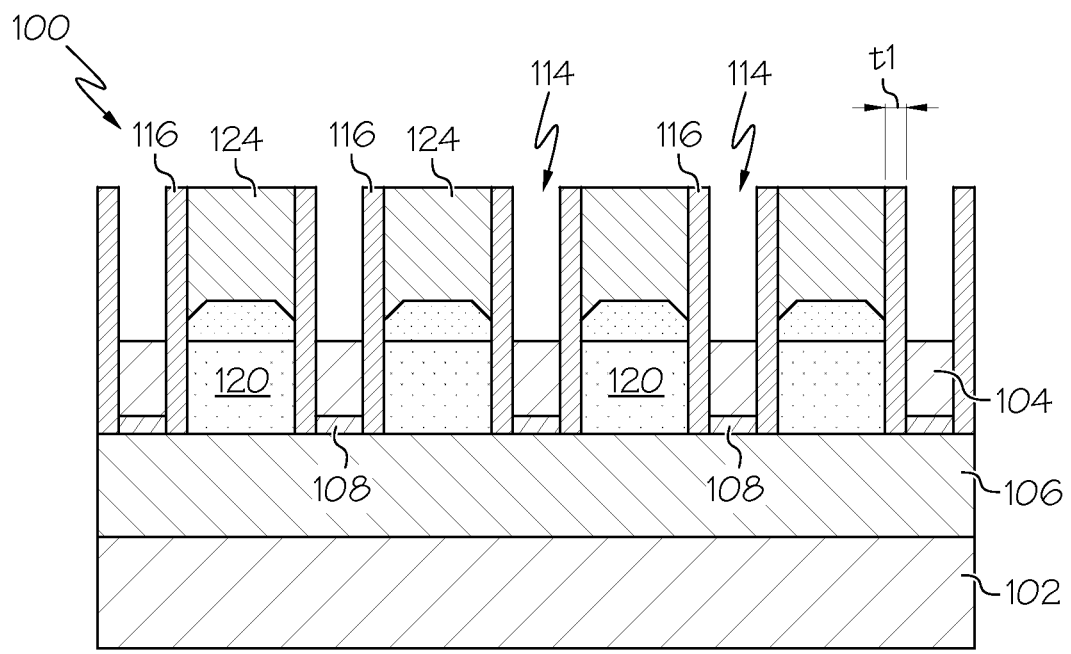
FIG. 8 shows a cross-sectional view of the removal of the gate electrodes according to illustrative embodiments.

Next, as shown in FIG. 7, an oxide material 124 is deposited over fins 104 and epi junction area 120, and planarized selective to SiN cap 112, which is then removed along with gate electrode 110, as shown in FIG. 8. In this embodiment, a polysilicon pull is performed, stopping on etch-stop layer 108. As shown, etch-stop layer 108 covers the transistor channel region.

Figure 9:
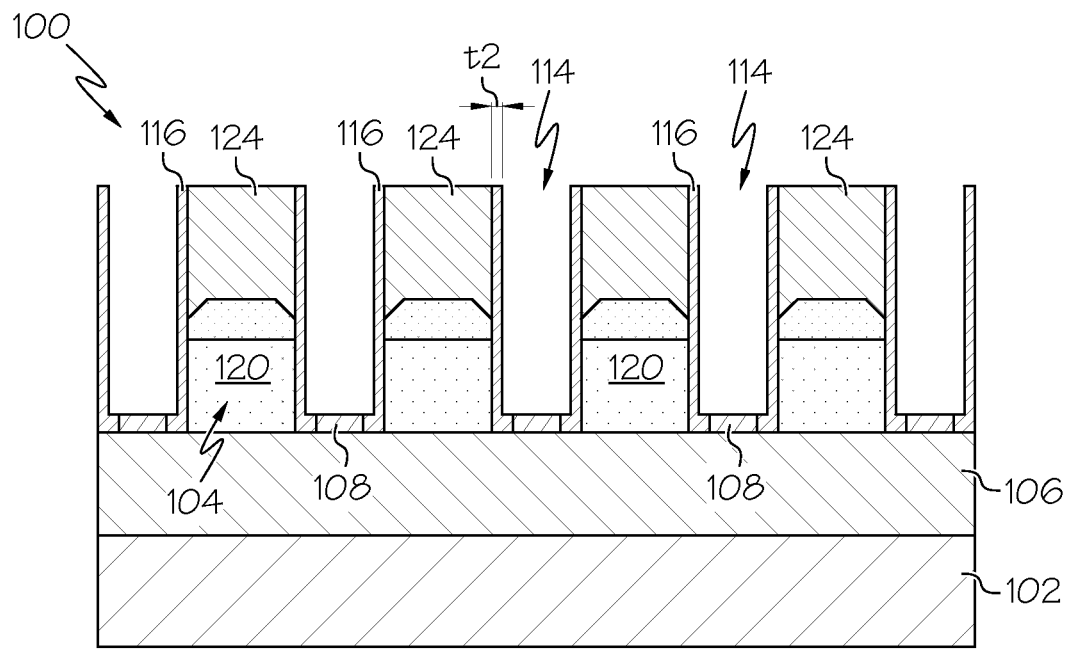
FIG. 9 shows a cross-sectional view between the set of fins after chamfering of the spacers according to illustrative embodiments.
Figure 10:
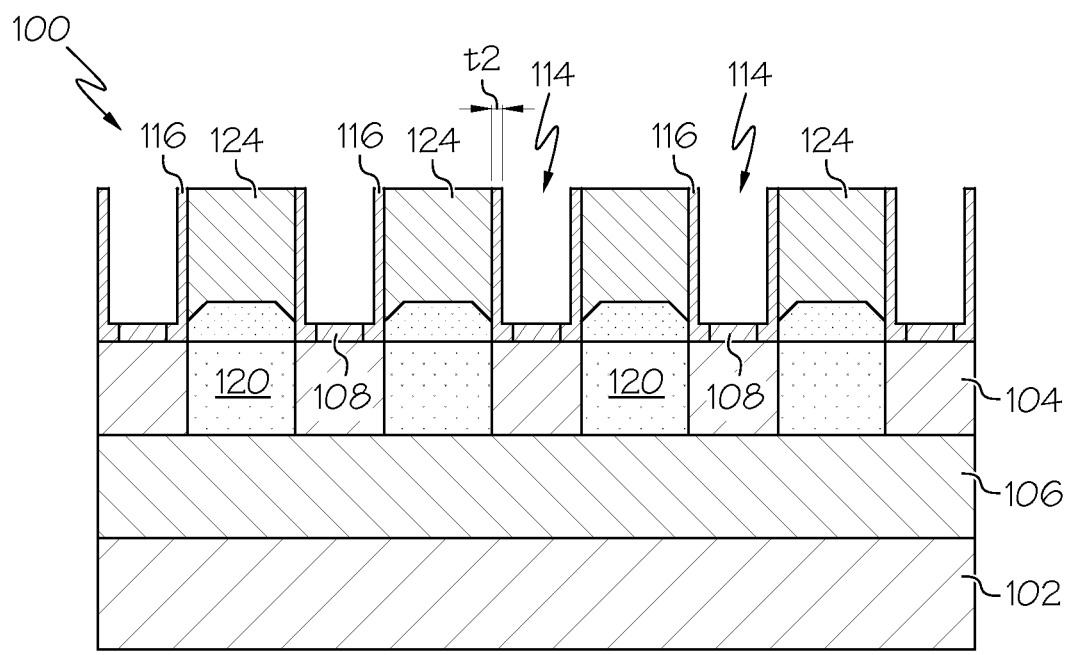
FIG. 10 shows a cross-sectional view through the set of fins after chamfering of the spacers according to illustrative embodiments.

Next, a RIE is performed to remove a portion of each spacer 116 to a top surface of etch-stop layer 108, as shown in FIG. 9. Here, a substantially vertical layer of SiN is removed from each spacer 116, resulting in a spacer thickness 't2', which is less than a thickness 't1' (FIG. 8) of spacers 116 prior to RIE. Chamfering each spacer results in a larger area available for a subsequent work-function metal (e.g., tungsten) deposition. As shown in the cross section between fins 104 of FIG. 9, each spacer 116 is chamfered selective to etch-stop layer 108, which is below a top surface of fins 104. Widening this region below the top surface of fins 104 is advantageous for WF metal deposition, as this region is the majority transistor gate region. Meanwhile, the original gate CD is maintained, because a portion the fin sidewall is covered by etch-stop layer 108. This is also demonstrated in the cross section through each fin 104 shown in FIG. 10. Here, the CD is also maintained along the top surface of fin 104, while the region above etch-stop layer 108 and fin 104 is widened.

Figure 11:
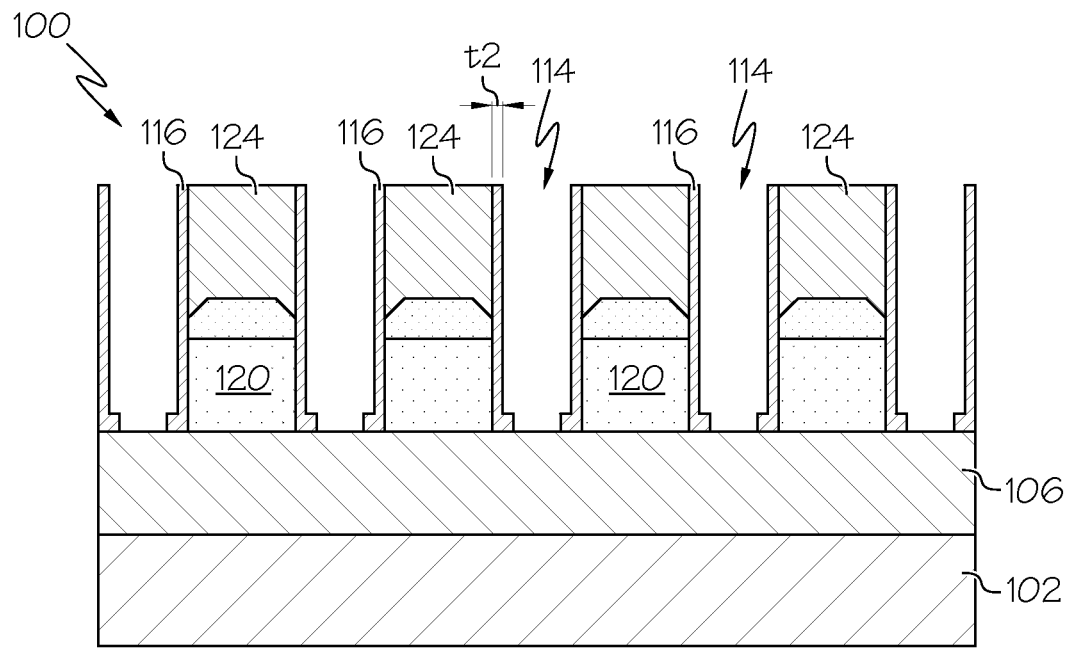
FIG. 11 shows a cross-sectional view between the set of fins after removal of the metal material from the RMG gate structures according to illustrative embodiments.
Figure 12:
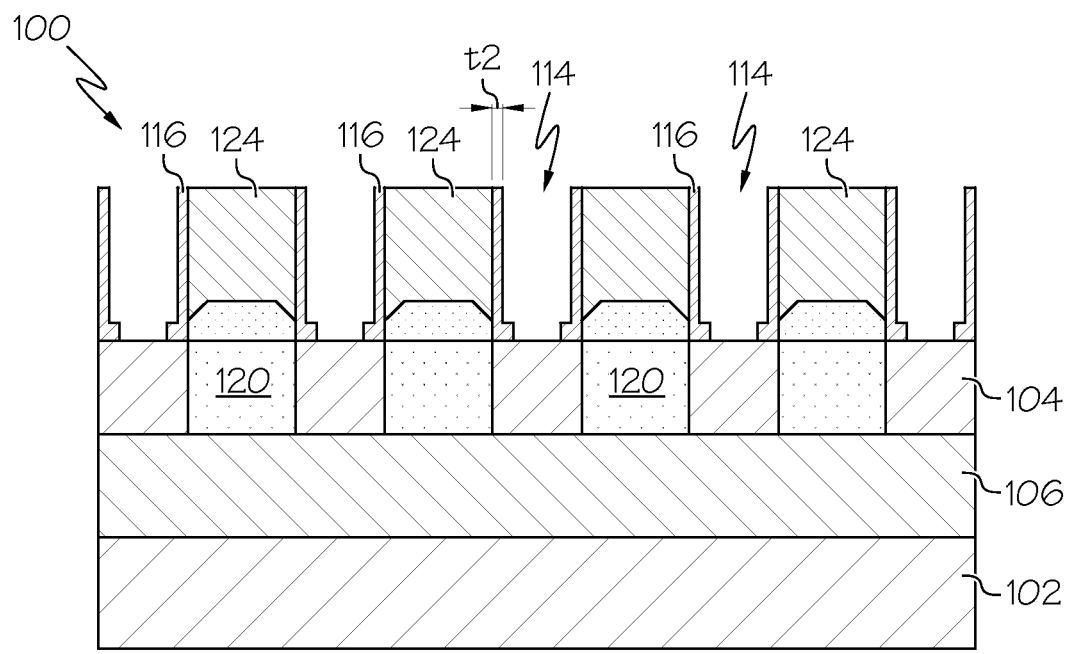
FIG. 12 shows a cross-sectional view through the set of fins after removal of the metal material from the RMG gate structures according to illustrative embodiments.

Next, etch-stop layer 108 is removed (e.g., via RIE) from device 100, as shown in the cross sectional view between fins in FIG. 11, and the cross sectional view through fin 104 in FIG. 12. Here, etch-stop layer 108 provides a self-aligned process for the RIE.

It will be appreciated that at least the following benefits are achieved as a result of the structure and processing steps described herein. First, the space between RMGs is widened, including the areas below and above the fin. This significantly improves the processing area for WF metal deposition. Second, the poly pull can use both RIE and a wet etch since poly Si has good selectivity. Third, a Si wet etch and poly partial pull has good selectivity to TiN (i.e., etch-stop layer 108), which avoids the RIE induced Si spacer on side wall (e.g., a nitride spacer), thus improving the uniformity.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided spacer chamfering a spacer for a RMG structure. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a semiconductor device, the method comprising:
   forming a set of fins from a substrate;
   conformally depositing a silicon-based layer over the set of fins;
   forming an etch-stop layer over the silicon-based layer, the etch-stop layer having a selectivity to at least one of: silicon, oxide, and nitride;
   forming a set of replacement metal gate (RMG) structures over the substrate;
   forming a set of spacers along each of the set of RMG structures;
   forming a plurality of epitaxial (epi) junction areas along the set of fins between each of the set of RMG structures;
   depositing an oxide over the set of fins;
   removing a gate electrode from each of the set of RMG structures; and
   removing a portion of each of the set of spacers to a top surface of the etch-stop layer.

2. The method according to claim 1, further comprising removing the etch-stop layer from the set of RMG structures.

3. The method according to claim 2, further comprising:
   forming a gate electrode layer over the semiconductor device;
   forming a silicon nitride (SiN) layer over the gate electrode layer;
   planarizing the semiconductor device; and
   removing the silicon-based layer and the etch-stop layer from each of the set of fins.

4. The method according to claim 1, the etch-stop layer comprising titanium nitride.

5. The method according to claim 1, the removing the portion of each of the set of spacers comprising etching the set of spacers to remove a layer of SiN.

6. The method according to claim 1, the removing the portion of each of the set of spacers comprising etching the set of spacers using a reactive ion etch.

7. The method according to claim 1, further comprising forming a source trench isolation oxide between each of the set of fins.

8. A method of chamfering a spacer for a replacement metal gate (RMG) structure, the method comprising:
   forming a set of fins from a substrate;
   conformally depositing a silicon-based layer over the set of fins;
   forming an etch-stop layer over the silicon-based layer, the etch-stop layer having a selectivity to at least one of: silicon, oxide, and nitride;
   forming a set of replacement metal gate (RMG) structures over the substrate;
   forming a set of spacers along each of the set of RMG structures;
   forming a plurality of epitaxial (epi) junction areas along the set of fins between each of the set of RMG structures;
   depositing an oxide over the set of fins;
   removing a gate electrode from each of the set of RMG structures; and
   removing a portion of each of the set of spacers to a top surface of the etch-stop layer, whereby each spacer is chamfered.

9. The method according to claim 8, further comprising removing the etch-stop layer from the set of RMG structures.

10. The method according to claim 9, further comprising:
    forming a gate electrode layer over the semiconductor device;
    forming a silicon nitride (SiN) layer over the gate electrode layer;
    planarizing the semiconductor device; and
    removing the silicon-based layer and the etch-stop layer from each of the set of fins.

11. The method according to claim 8, the etch-stop layer comprising titanium nitride.

12. The method according to claim 8, the removing the portion of each of the set of spacers comprising etching the set of spacers to remove a layer of SiN.

13. The method according to claim 8, the removing the portion of each of the set of spacers comprising etching the set of spacers using a reactive ion etch.

14. The method according to claim 8, further comprising forming a source trench isolation oxide between each of the set of fins.

* * * * *